United States Patent [19] [11] Patent Number: 5,448,113
Suzuki et al. [45] Date of Patent: Sep. 5, 1995

[54] MICRO METAL-WIRING STRUCTURE HAVING STRESS INDUCED MIGRATION RESISTANCE

[75] Inventors: Kouei Suzuki, Hyogo; Kouichi Ohtaka, Matsugagoshi; Ikue Kawashima, Sendai; Shuichi Hikichi, Tsukinokinishi, all of Japan

[73] Assignees: Ricoh Company, Ltd., Tokyo; Ricoh Research Institute of General Electronics Co., Ltd., Notori, both of Japan

[21] Appl. No.: 352,856

[22] Filed: Dec. 2, 1994

Related U.S. Application Data

[63] Continuation of Ser. No. 27,985, Mar. 8, 1993, abandoned.

[51] Int. Cl.$^6$ ............ H01L 23/48; H01L 29/46; H01L 29/54
[52] U.S. Cl. .................. 257/767; 257/758; 257/759; 257/765; 257/771
[58] Field of Search ............ 257/736, 758, 759, 765, 257/767, 771, 774, 781

[56] References Cited

U.S. PATENT DOCUMENTS

| | | |
|---|---|---|
| 4,438,450 | 3/1984 | Sheng et al. ............ 257/767 |
| 4,989,064 | 1/1991 | Kubokoya et al. ......... 257/771 |
| 5,018,001 | 5/1991 | Kondo et al. ............ 257/771 |
| 5,019,891 | 5/1991 | Onki et al. .............. 257/771 |
| 5,187,561 | 2/1993 | Hasunuma et al. ......... 257/771 |

OTHER PUBLICATIONS

Applied Physics Letters, vol. 60, No. 18, May 4, 1992, pp. 2219–2221, H. Longworth, et al., "Experimental Study of Electromigration in Bicrystal Aluminum Lines".

Japanese Vacuum Science Technology, B(8), Nov./Dec. 1990, pp. 1232–1238, Y. Koubuchi, et al., "Stress Migration Resistance and Contact Characterization Of Al–Pd–Si Interconnects for Very Large Scale Integrations".

Japanese Metal Society Report, vol. 28, No. 1, 1989, pp. 40–47.

*Primary Examiner*—Sara W. Crane
*Assistant Examiner*—Carl Whitehead, Jr.
*Attorney, Agent, or Firm*—Oblon, Spivak, McClelland, Maier, & Neustadt

[57] ABSTRACT

A micro metal-wiring construction comprises a substrate having a first insulating layer thereon, a metal wiring formed on the first insulating layer of the substrate, and a second insulating layer covering the metal wiring. The coefficient of thermal expansion of the metal wiring is greater than those of the first and the second insulating layers. Intersection lines formed between grain boundaries of the metal wiring and a surface of the first insulating layer is nearly perpendicular to an extending direction of the metal wiring and an angle between grain boundary planes and a line that is perpendicular to a surface of the first insulating layer is greater than 20 degrees. Metal-wiring having a good resistance against stress-induced-migration is obtained by providing when this angle is greater than 20°.

22 Claims, 5 Drawing Sheets

FIG. IA PRIOR ART
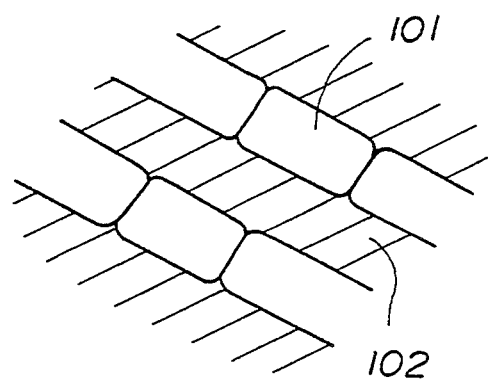
FIG. IB PRIOR ART
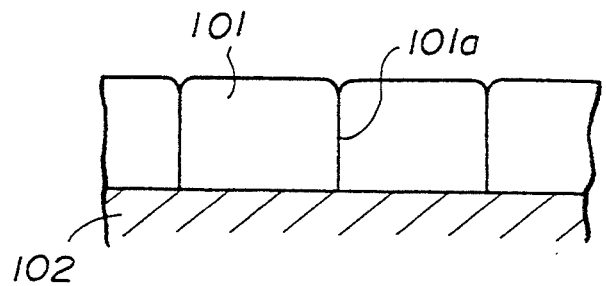

MICRO METAL-WIRING STRUCTURE HAVING STRESS INDUCED MIGRATION RESISTANCE

This application is a Continuation of application Ser. No. 08/027,985, filed on Mar. 8, 1993, now abandoned.

BACKGROUND OF THE INVENTION

The present invention relates to a micro metal-wiring structure used in a large-scale integrated circuit.

Aluminum wiring is widely used for a large-scale integrated circuit as characteristics of aluminum are suitable for micro wiring construction. An example of a conventional aluminum wiring construction is shown in FIGS. 1A and 1B. Since the width of the aluminum wiring has become very small, aluminum grains 101 are arranged along the extending direction of the wiring such that the grain boundary lies perpendicular to the extending direction of the wiring and crosses the entire width of the wiring. This structure is referred to as a bamboo structure. As reported in Japanese metal society report vol.28, No.1, p40–47, in this bamboo structure, resistance against an electro-migration (to be defined later) is improved but resistance against a stress-induced-migration (to be defined later) is decreased.

Electro-migration is a phenomenon that occurs in a metal wiring when the wiring is kept under a high temperature and a high current density. Under such conditions, a void may be locally generated and the void then growing to become a large defect; results in an increase in the electric resistance or in an occurrence of an open failure. The generation of a void is caused by a migration of the metal atoms due to movement of electrons. The void is usually generated along the grain boundary.

Stress-induced-migration is a phenomenon that occurs in the grain boundary of aluminum under only a high temperature condition. A void is generated due to a stress caused by thermal expansion differences between a silicon substrate (Si), an aluminum alloy, and an insulating layer surrounding the aluminum alloy. The linear expansion coefficient of silicon is $2.5 \times 10^{-6} K^{-1}$, of aluminum alloy $25 \times 10^{-6} K^{-1}$, and of the insulation layer only a few $10^{-6} K^{-1}$. The thermal expansion of the aluminum alloy differs from that of the other materials by one or two orders of magnitude. Due to these thermal expansion differences, a stress is exerted on the grain boundary of the aluminum wiring, and hence it is said that a void occurs in the grain boundary due to stress. The occurrence of a void results in fracture of the wiring. In the bamboo structure, since the cross section of the grain boundary is small and the boundary crosses the extending direction of the wiring, wire fracture occurs easily due to stress-induced-migration. A solution to this problem is desirable.

In order to decrease the possibility of a wire fracture due to stress-induced-migration, adding copper (Cu) or paradium (Pd) to Al—Si alloy was suggested in *J. Vac.-Sci. Technol.* B8(6),Nov/Dec 1990, P.1232. This technical paper describes that segregation of Cu or Pd in the Al grain boundary, increases a bonding force of the grains. Additionally, there has been suggested that provision of transition elements, or silicide or nitride of transition elements, which have a high melting point, between layers decreases a wire fracture rate.

However, since further integration of the large-scale integrated circuit is desirable, and micronization of wiring has been further advanced, a decrease in the service life of wiring due to stress-induced-migration has become an important problem.

In order to obtain a reliable wiring, it is required to increase an amount of supplemental metal, however, the increase in amount of supplemental metal increases a resistance of the wiring. Additionally, segregation of the supplemental metal increases possibilities of boundary corrosion and increases occurrence of formation of undesirable remaining portions formed during the etching process. Further, there is a problem associated with target manufacturing when using a different metal to be added.

Furthermore, with regard to stacking of the material, under conditions where constant thickness of the wiring is maintained, layers other than the Al layer should be made thick so as to maintain reliability. However, since materials having a high melting point, such as tungsten (W), have also a high resistance compared to that of aluminum (Al), an increase of the effective resistance of the wiring is not avoided. Conversely, in a condition where a constant electric resistance is maintained, the wiring should be made thick so as to maintain an appropriate current path, and thus the difference in heights between the wire and the substrate becomes large resulting in difficulty of planarization when applying an insulating material over the wiring and over the surface of the substrate.

Accordingly, in micro metal-wiring construction used in a large-scale integrated circuit, it is required to implement measures for stress-induced-migration so as to avoid an increase of the electric resistance of wiring while maintaining electro-migration at a low level.

SUMMARY OF THE INVENTION

It is a general object of the present invention to provide an improved and useful micro metal-wiring construction in which the above-mentioned problems are eliminated.

A more specific object of the present invention is to provide a micro metal-wiring construction used in a large-scale integrated circuit, which metal-wiring construction has a strong resistance against either electro-migration or stress-induced-migration.

In order to achieve the above mentioned objects, a micro metal-wiring construction according to the present invention comprises:

a substrate having a first insulating layer thereon, the first insulating layer having a first coefficient of thermal expansion;

a metal wiring formed on the insulating layer of the substrate, the metal wiring having a second coefficient of thermal expansion; and a second insulating layer covering the metal wiring, the second insulating layer being made of an insulating material having a third coefficient of thermal expansion, wherein, the second coefficient of thermal expansion is greater than the first and the third coefficients of thermal expansion, grain boundaries of the metal wiring lie nearly perpendicular to an extending direction of the metal wiring, and an angle formed between a plane of the grain boundaries and a line perpendicular to a surface of the first insulating layer is more than 20 degrees.

According to the present invention, a metal wiring having a good resistance against stress-induced-migration is obtained by providing an angle greater than 20° between a plane of the grain boundary and a line perpendicular to the surface of the insulating layer of the substrate.

Other objects, features and advantages of the present invention will become more apparent from the following detailed description when read in conjunction with the accompanying drawings.

BRIEF DESCRIPTION OF THE DRAWINGS

FIG. 1A is a plane view of an example of a conventional metal-wiring construction; FIG. 1B is a cross sectional view of the metal-wiring construction shown in FIG. 1A.

DETAILED DESCRIPTION OF THE PREFERRED EMBODIMENTS

Figure 2:
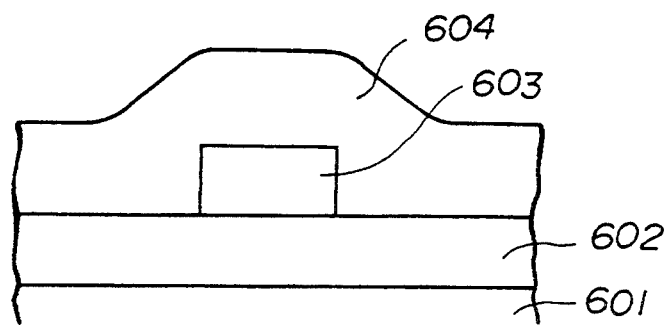
FIG. 2 is a cross sectional view of an example of a metal-wiring construction.

Stress-induced-migration is generated by differences between coefficients of thermal expansion of a metal-wiring film and a film surrounding the metal wiring. FIG. 2 is an example of a cross sectional view of a metal-wiring construction. The metal-wiring construction shown in FIG. 2 comprises a substrate 601, an insulating layer 602 formed on the substrate 601, a metal-wiring 603 formed on the insulating layer 602, and a passivation film 604 formed over the metal-wiring and the insulating layer 602. The metal wiring 603 is formed of an aluminum alloy (Al). The insulating layer 602 and the passivation film 604 are formed of an insulating film having a smaller coefficient of thermal expansion than that of Al, for example, a silicon oxide film or a silicon nitride film. Since the metal wiring 603 is surrounded by the insulating layer 602 and the passivation film 604, a tensile stress is exerted on the metal wiring 603 due to the differences in coefficients of thermal expansion. The tensile stress is exerted in a direction perpendicular to the extending direction of the metal-wiring as well as along the extending direction of the metal wiring. However, since the length of the metal wiring is much longer than the thickness of the metal wiring, stress in the extending direction of the metal wiring is greater than stress in a perpendicular direction thereof. The absolute value of the stress is dependent on a forming temperature of the metal wiring 603, the insulating layers 602 and the passivation film 604, and on a structure of these films. It is known that the stress in the extending direction of the wiring is five times greater than that in perpendicular direction (Proc. 1990 Int. Relia. Phys. Symp., p221).

Figure 3:
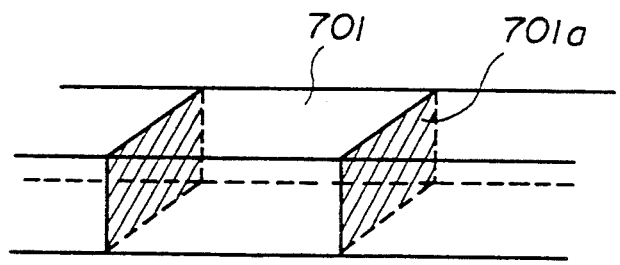
FIG. 3 is a perspective view of a wiring for explaining a grain boundary.

Next will be discussed the stress-induced-migration of the metal-wiring under the conditions mentioned above. As mentioned above, with progress in miniaturization of semiconductor elements, the metal wiring is being formed such that a width of the metal-wiring is only a width of a single metal-grain, as shown in FIG. 3. Accordingly one grain boundary 701a spans over the entire cross section of metal-wiring in which grains 701 are arranged in a row. Such a construction is called a bamboo structure. Stress-induced-migration, here, is generated due to a fracture of a grain boundary when a stress is exerted in the grain boundary. Fracture of the grain boundary occurs when the stress $\sigma$ applied perpendicularly to the boundary exceeds a limit value $\sigma_0$.

Figures 4A, 4B:
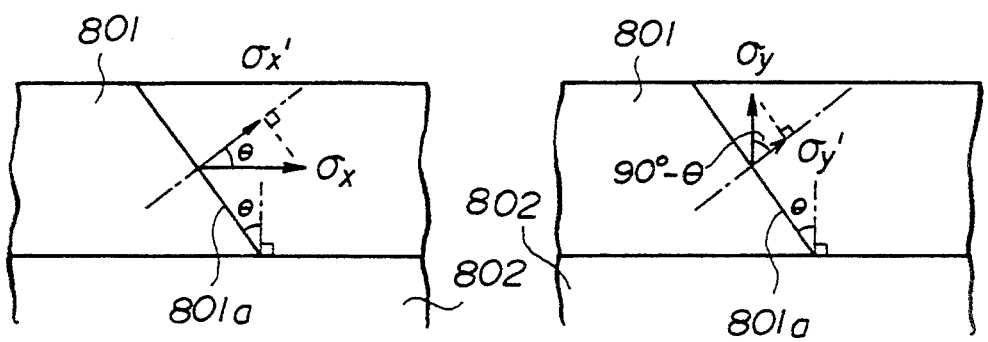
FIGS. 4A and 4B are an illustration for explaining a stress exerted to a grain boundary.

FIG. 4a is an illustration of stress applied to a grain boundary 801a slanting to a line perpendicular to a surface of a substrate 802. The slanting angle is indicated by $\theta$. The stress exerted in the direction perpendicular to the grain boundary is a sum of $\sigma_x'$ and $\sigma_y'$ shown in FIG. 4A and FIG. 4B. $\sigma_x'$ is a component, in a direction perpendicular to the grain boundary 801a, of the stress $\sigma_x$, which stress along the $\sigma_x$ is a stress extending direction of the wiring. $\sigma_y'$ is a component, in a direction perpendicular to the grain boundary 801a, of the stress $\sigma_y$, which stress $\sigma_y$ is a stress in the direction perpendicular to the surface of the substrate 802.

$$\sigma = \sigma_x' + \sigma_y' \qquad (1)$$

Accordingly, in case the angle between the grain boundary 801a and a line perpendicular to the surface of the substrate 802 is $\theta$, the following relationship is established;

$$\sigma_x' = \sigma_x \cos\theta, \quad \sigma_y' = \sigma_y \sin\theta$$

Applying the above relationship to the equation (1) results in the following equation (2).

$$\sigma = \sigma_x \cos\theta + \sigma_y \sin\theta \qquad (2)$$

Figure 5:
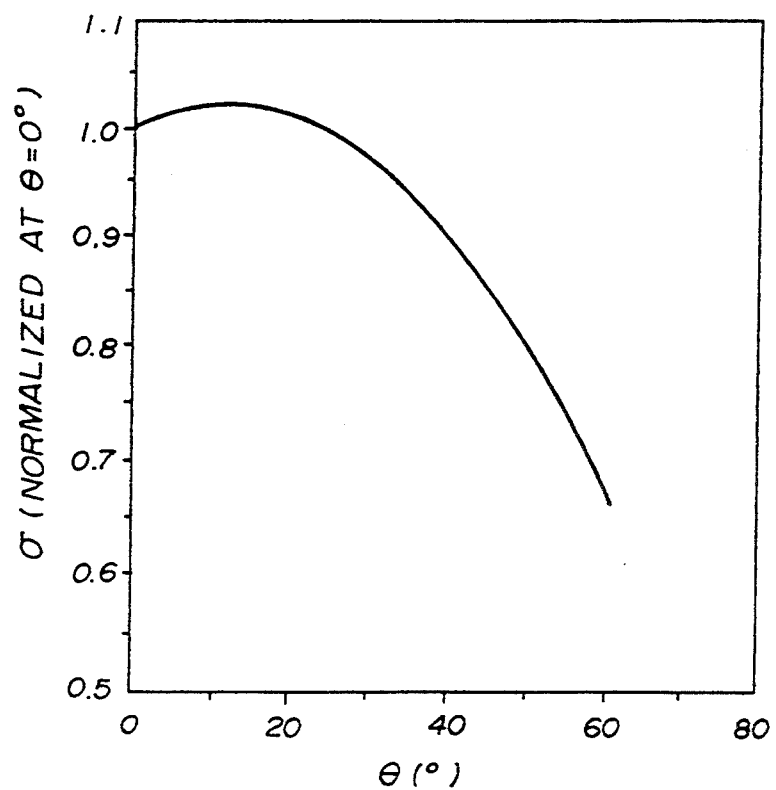
FIG. 5 is a graph showing a result of calculations for stresses exerted on a grain boundary at various angles $\theta$.

By applying the equation (2), with the assumption that the value of the stress $\sigma_x$ is five times greater than the stress $\sigma_y$, as described in the technical paper previously mentioned, and then normalizing using the value at $\theta = 0°$, the result shown in FIG. 5 is obtained. Judging from the graph shown in FIG. 5, the value of $\sigma$ becomes smaller than that when $\theta = 0°$, when the angle $\theta$ exceeds approximately 20°. Accordingly, it is expected that stress-induced-migration resistance is increased by slanting the grain boundary to be more than 20° from a line perpendicular to the surface of the substrate.

The effect of the present invention can be expected in a case where only a portion of grain boundary has a strength against a stress. That is, the effect of the present invention can be obtained for the part of the wiring in which part of the grain boundary slants more than 20° with respect to a line perpendicular to the surface of the material.

Further, it is known that resistance against stress-induced-migration decreases when the grain boundary slants with respect to the direction of the width of the wiring (Appl. Phys. Lett., Vol.60 1992 p.2219). However, the concerned construction of the wiring is different from that of the present invention in which the grain boundary slants with respect to a line perpendicular to the surface of the substrate. It is also known that resistance against electro-migration strongly depends on the testing temperature, on current density, and on stress exerted to the wiring. Considering the above matter, it is obvious that stress exerted on wiring has a very complex mechanism.

Figure 6A:
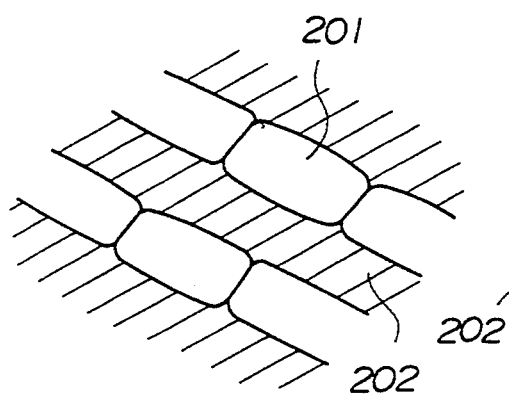
FIG. 6A is a plan view of a first embodiment of a metal-wiring construction according to the present invention.
Figure 6B:
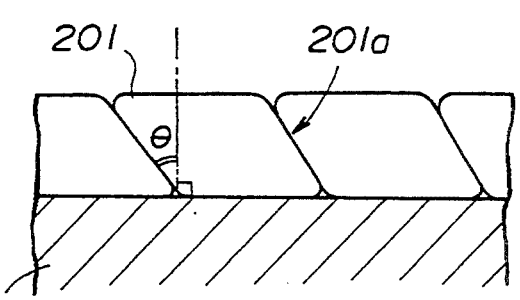
FIG. 6B is a cross sectional view of the metal wiring construction shown in FIG. 6A.

FIG. 6A is a plan view of a first embodiment of a metal-wiring construction according to the present invention, and FIG. 6B is a cross sectional view of the metal-wiring construction shown in FIG. 6A. A metal-wiring construction comprises a metal grain 201 and a width of the wiring is less than 1 μm. The metal-wiring is formed on the substrate 202. As shown in FIG. 6A, the width of the wiring corresponds to the width of the grain 201 and the wiring has a bamboo structure. As shown in FIG. 6b, each grain boundary 201a slants with respect to a line perpendicular to the surface of the substrate 202, and the slanting angle is more than 20 degrees. Compared to the conventional wiring construction, as shown in FIGS. 1A and 1B, in which the direction of the grain boundary corresponds to a line perpendicular to the surface of the substrate, tensile stress exerted on the boundary due to the difference in thermal expansion are decreased. Thus, an occurrence rate of fracture of the wiring is decreased and a reliability of the wiring is improved.

As a metal grain 201 comprising a metal-wiring construction, the following aluminum alloys may be used other than aluminum: Al—Si, Al—Si—Cu, Al—Cu, Al—Si—Pd, Al—Pd, Al—Ti.

Metal wiring having such a slanting grain-boundary can be produced by means of a vapor deposition method or a sputtering method. By using an IBS (Ion Beam Sputtering) method or an IVD (Ion Vapor Deposition) method, the grain boundary can be made slanted by radiating ion beams to the substrate from a diagonal direction thereof. As the source of the ion beam, an inert gas such as Helium (He), Neon (Ne), Argon (Ar), Kripton (Kr), or Xenon (Xe) may be used. In the IBS method, a desirable voltage and current applied for generating the assisting ion beam diagonally incident on the substrate may be, respectively, from 100 eV to 5 keV and from 0.05 to 10 mA/cm². The assisting ion beam is used for controlling the slanting angle θ of the grain boundary. Further, in order to eliminate an influence of the substrate, a relatively strong assist ion beam is desirable when forming the initial layer. As for the assisting ion beam, a voltage from 1 to 5 KeV and a current from 0.2 to 10 mA/cm² are recommended for forming of the initial layer. The desired thickness of the initial layer is from 100 Å to 2000 Å.

Figure 7A:
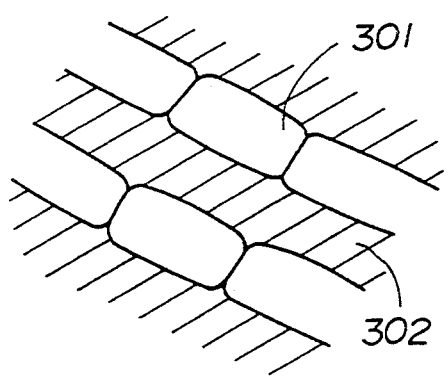
FIG. 7A is a plan view of a second embodiment of a metal-wiring construction according to the present invention.
Figure 7B:
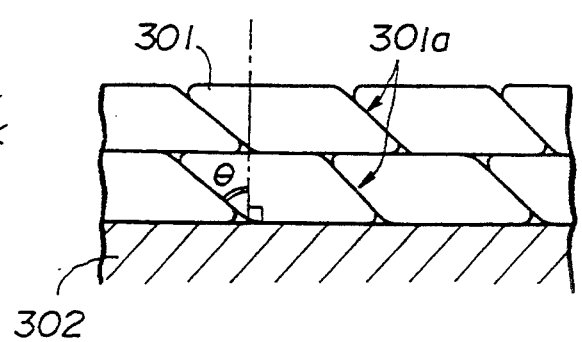
FIG. 7B is a cross sectional view of the metal wiring construction shown in FIG. 7A.

A second embodiment of a metal-wiring construction according to the present invention is shown in FIGS. 7A and 7B. FIG. 7A is a plan view and FIG. 7B is a cross sectional view of the second embodiment. In this embodiment, wiring is formed in two layers. Similarly to the first embodiment, the wiring has a width corresponding to the width of a grain 301 and each grain boundary 301a slants with respect to a line perpendicular to the surface of the substrate 302. This two layered construction can be made by performing a deposition process two times. As apparent from the figure, the grain boundary 301a of the upper layer does not correspond to the grain boundary 301a of the lower layer. By constructing this manner, stress-induced-migration can be further reduced. It should be noted that shifting the grain boundaries of the upper layer from the lower layer can be achieved by an open air method or by providing an intermediate layer having a high melting point such as W or TiN. The methods are explained in the following.

A description will now be given of a forming method of the micro metal-wiring construction according to the present invention.

EXAMPLE 1

Figure 8:
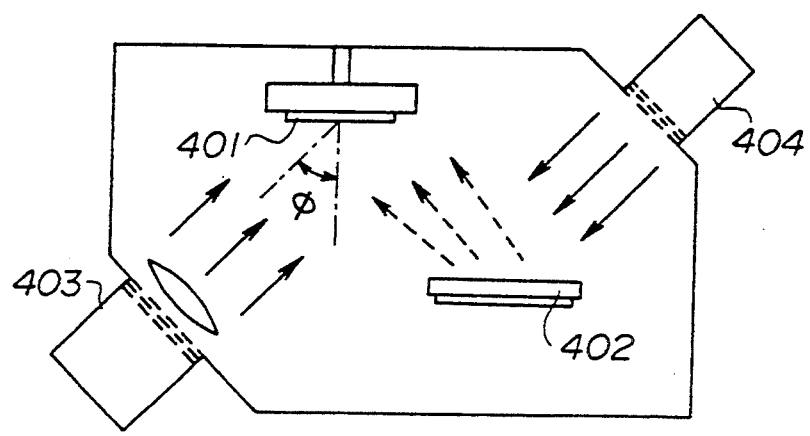
FIG. 8 is an illustration of an ion-beam supporting apparatus for producing a metal-wiring film.
Figure 9:
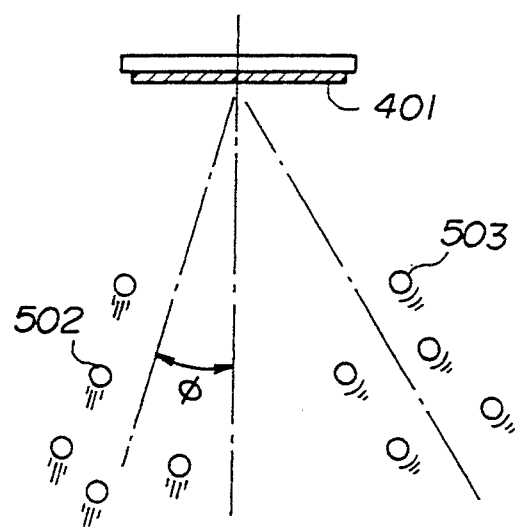
FIG. 9 is an illustration for explaining an assisting ion beam radiating angle o.

An Al—Si—Cu alloy wiring layer was produced by using an IBS apparatus shown in FIG. 8. A single crystal Si substrate provided with thermal oxidized film having <100> plane orientation was used as a substrate 401. As a target 402, an alloy Al—1%Si—0.5-%Cu was used. Sputtering of the target 402 was performed by operating a sputter ion source 404 with irradiation of Ar+ ions. Some of the Ar+ ions were generated by an assisting ion source 403 from a direction that was diagonal to the substrate 401. The sputter ion source 404 and the target 402 were arranged so that atoms of the target 402 were radiated in a direction diagonal to the substrate 401. The assisting ions (Ar+ ions) 502 were incident upon the substrate from the direction at which their radiating angle o slanted from a line perpendicular to the surface of the substrate 401, as shown in FIG. 9. The angle θ between the grain boundary direction and a line perpendicular to the surface of the substrate 401 was varied by varying the radiating angle o.

First, Al—Si—Cu alloy film having 500 Å was deposited on the substrate 401 under the following conditions so as to eliminate variations due to the substrate material. An acceleration voltage of the assisting ions (Ar+ ions) was 2 keV and an acceleration current of the assist ion was 1 mA/cm². An acceleration voltage of the sputtering ion was 1 kV and an acceleration current of the sputtering ion was 100 mA. Flow rate of Ar gas was 5 sccm. Pressure was $1 \times 10^{-4}$ Torr. Temperature of the substrate 401 was 150° C. Following the deposition of 500 Å of initial layer, the acceleration voltage was changed and then Al—Si—Cu alloy film having a total thickness of 1 μm was deposited. The acceleration voltage was set to 0.2, 0.5, 0.7, 1.0 and 1.5 KeV. This deposition was performed under the condition such that the radiating angle o was 10°, 20°, 40° and 60°. After forming of Al—Si—Cu layer the angle θ was measured by using a Scanning Electron Microscope (SEM). The obtained results are shown in the following table.

| | Acceleration voltage (keV) | | | | |
|---|---|---|---|---|---|
| | 0.2 | 0.5 | 0.7 | 1.0 | 1.5 |
| φ = 10° | 3 | 6 | 8 | 11 | 10 |
| φ = 20° | 5 | 13 | 15 | 19 | 21 |
| φ = 40° | 12 | 24 | 32 | 42 | 40 |
| φ = 60° | 17 | 31 | 50 | 57 | 58 |

As apparent from the above-table, increase of the angle θ falls off above around 1.0 keV of acceleration voltage regardless of the value of the radiating angle o, and when acceleration voltage exceeds 1.0 keV, the angle θ is nearly equal to the radiating angle o.

Accordingly, it was found that the angle θ can be controlled by varying the radiating angle o while the acceleration voltage of the constant assisting ion beam remains at 1 keV. For any angle θ an Al—Si—Cu film having a low resistance, such as $3 \times 10^{-8}$ Ωm, was obtainable after heat treatment at 400° C. for 20 min.

Next, 1 μm thick Al—Si—Cu films having various values of the angle θ were prepared in accordance with the above-mentioned conditions. Each film was processed so that wiring having 25 cm in length and 0.9 μm in width was formed. A heat treatment at 400° C. for 20 min. was applied to each processed film. Then an SiN film having 1.0 μm thickness was formed over the wiring and the substrate using a plasma method under the following conditions; the temperature of the substrate was 350° C., the flow rate of SiH$_4$ was 200 sccm, the flow rate of NH$_3$ was 50 sccm, the flow rate of N$_2$ was 4000 sccm, and the pressure was 5 Torr.

100 samples were prepared for each angle θ. The samples were kept at 50° C. for 1000 hours, and then respective resistances against stress-induced-migration were evaluated by supplying a current of 0.1 mA to each wiring and measuring the resistance of each of the wirings. The following table shows the results of the evaluation.

|  | Angle θ | | | | | | |
|---|---|---|---|---|---|---|---|
|  | 0 | 7 | 15 | 19 | 28 | 42 | 57 |
| Defect Rate | X | X | X | ○ | ⊙ | ⊙ | ⊙ |

(X: 10–40%, ○: 5–10%, ⊙: less than 5%)

Judging from the above table, a defect rate, due to wiring fracture, becomes low when the angle θ is greater than about 20°. That is, a wiring having an improved resistance against the stress-induced-migration was obtained by using an angle θ greater than 20°.

EXAMPLE 2

Aluminum alloys: Al—1%Si, Al—1%Si—0.5%Cu, Al—1%Cu, were used as a target material. The radiating angle o was 0° and 30°. Other conditions were similar to that in example 1. The following table shows results of evaluation for the stress-induced-migration.

|  | radiating Angle φ | |
|---|---|---|
|  | 0° | 30° |
| Al-Si | X | ○ (31) |
| Al-Si-Cu | X | ⊙ (28) |
| Al-Cu | X | ⊙ (33) |

(X: 10–40%; ○: 5–10%, ⊙: less than 5%)
The values in parentheses correspond to the angle θ.

Judging from the above-table, under the above conditions, resistance against the stress-induced-migration for Al—Si—Cu and Al—Cu is improved more than that for Al—Si.

EXAMPLE 3

Aluminum alloy, Al—Si—Cu, was used as a target and a layered metal-wiring construction as shown in FIG. 7B was formed. A double layered construction and a triple layered construction were also formed. In the double layered construction, Al—Si—Cu alloy film was formed with a thickness of 0.5 μm. A processing chamber was open to the air so as to oxidize the surface of the film. Then Al—Si—Cu alloy film was formed on the oxidized surface so that the total thickness became 1 μm. The radiating angle of the assisting ion beam was 30°. Similarly to the double layered construction, the triple layered construction was formed with film thickness of 0.4 μm, 0.3 μm, and 0.3 μm. The film was formed with a wiring similar to that described in Example 1, and was kept at 50° C. for 2000 hours. The following table shows the results of evaluation.

|  | single layer | double layer | triple layer |
|---|---|---|---|
| Defect rate | ○ | ⊙ | ⊙ |

(○: 5–10%, ⊙: less than 5%)

Every sample showed a good resistance against stress-induced-migration. The double and the triple layered samples showed a slightly better resistance against stress-induced-migration compared to the single layered sample.

As described in the above, a metal-wiring having a good resistance against stress-induced-migration can be obtained by having the angle between a direction of grain boundary and a line perpendicular to the surface of the substrate be greater than 20°. Additionally, by having a layered construction, a wiring having further improved resistance against the stress-induced-migration can be obtained.

The present invention is not limited to the specifically disclosed embodiments, and variations and modifications may be made without departing from the scope of the present invention.

What is claimed is:

1. A micro metal-wiring construction used in a large-scale integrated circuit, which micro metal-wiring construction comprises:

a substrate having a first insulating layer thereon, said first insulating layer having a first coefficient of thermal expansion and an upper surface;

a metal wiring formed on said upper surface of said first insulating layer of said substrate, said metal wiring having a second coefficient of thermal expansion, said metal wiring being elongated along an extending direction and comprising a plurality of grain boundaries, each one of said plurality of grain boundaries defining a grain boundary plane; and a second insulating layer covering said metal wiring, said second insulating layer being made of an insulating material having a third coefficient of thermal expansion, wherein, said second coefficient of thermal expansion is greater than said first and said third coefficients of thermal expansion, wherein lines formed by the intersection between each of the grain boundary planes of said plurality of grain boundaries and said upper surface of said first insulating layer are perpendicular to said extending direction of said metal wiring, and angles formed between the grain boundary planes of said plurality of grain boundaries and a line that is perpendicular to said upper surface of said first insulating layer are greater than 20 degrees.

2. The micro metal-wiring construction as claimed in claim 1, wherein said wiring comprises a plurality of metal grains aligned in the extending direction of said metal wiring, and a width of said metal wiring corresponds to a width of said grain boundary.

3. The micro metal-wiring construction as claimed in claim 1, wherein said metal wiring is made of an aluminum alloy.

4. The micro metal-wiring construction as claimed in claim 3, wherein a material of said metal wiring is selected from a group consisting of: Al, Al—Si, Al—Si—Cu, Al—Cu, Al—Si—Pd, Al—Pd, and Al—Ti.

5. The micro metal-wiring construction as claimed in claim 1, wherein said metal wiring is formed in a plurality of layers, and grain boundaries between adjacent two layers lie in different planes.

6. The micro metal-wiring construction as claimed in claim 5, wherein an oxidized film is provided between said layers.

7. The micro metal-wiring construction as claimed in claim 5, wherein said metal wiring is made of an aluminum alloy.

8. The micro metal-wiring construction as claimed in claim 7, wherein a material of said metal wiring is selected from a group consisting of: Al, Al—Si, Al—Si—Cu, Al—Cu, Al—Si—Pd, Al—Pd, and Al—Ti.

9. A micro metal-wiring construction according to claim 1, wherein said metal-wiring comprises an alloy of aluminum and copper.

10. A micro metal-wiring construction for use in a large-scale integrated circuit, comprising;
a substrate having a first insulating layer thereon, said first insulating layer having a first coefficient of thermal expansion and an upper surface,
a metal wiring formed on said upper surface of said first insulating layer of said substrate, said metal wiring having a second coefficient of thermal expansion, said metal wiring being elongated along an extending direction and comprising a plurality of grain boundaries, at least one of said plurality of grain boundaries defining a grain boundary plane, and
a second insulating layer covering said metal wiring, said second insulating layer being made of an insulating material having a third coefficient of thermal expansion,
wherein, said second coefficient of thermal expansion is greater than said first and said third coefficients of thermal expansion,
wherein a line formed by the intersection between said grain boundary plane and said upper surface of said first insulating layer is nearly perpendicular to said extending direction of said metal wiring, and an angle between said grain boundary plane and a line that is perpendicular to said upper surface of said first insulating layer is greater than 20 degrees.

11. A micro metal wiring construction in a large scale integrated circuit, comprising:
a substrate having an upper surface and a lower surface;
a first insulating layer having a lower surface on the upper surface of the substrate and having an upper surface, said first insulating layer having a first coefficient of thermal expansion;
a metal wiring on the upper surface of the first insulating layer, said metal wiring having a second coefficient of thermal expansion, said metal wiring being elongated along an extending direction, said metal wiring comprising a plurality of grain boundaries, each one of said plurality of grain boundaries defining a corresponding plurality of grain boundary planes;
a second insulating layer covering said metal wiring, said second insulating layer made of an insulating material having a third coefficient of thermal expansion;
wherein said second coefficient of thermal expansion is greater than said first coefficient of thermal expansion and is greater than said third coefficient of thermal expansion; and wherein each of said corresponding plurality of grain boundary planes forms an angle of greater than twenty degrees with a line that is perpendicular to said upper surface of said first insulating layer.

12. The construction according to claim 11, wherein said metal wiring comprises a plurality of metal grains that are aligned in the extending direction of said metal wiring, wherein said metal wiring has a width in a direction that is parallel to said upper surface of said substrate and is perpendicular to said extending direction, wherein each of said plurality of grain boundaries has a width in a direction that is parallel to said upper surface of said substrate and that is perpendicular to said extending direction, wherein said width of said metal wiring is equal to said width of each said plurality of grain boundaries.

13. The construction according to claim 11, wherein said metal wiring is formed from an aluminum alloy.

14. The construction according to claim 11, wherein said metal wiring is made from aluminum or an aluminum alloy that is selected from the group consisting of aluminum-silicon, aluminum-silicon-copper, aluminum-copper, aluminum-silicon-palladium, aluminum-palladium, and aluminum-titanium.

15. The construction according to claim 11, wherein:
said metal wiring forms a plurality of layers of metal grains comprising a first layer of metal grains having an upper surface and a second layer of metal grains having a lower surface that is above the upper surface of the first layer of metal grains,
wherein said plurality of grain boundaries comprises grain boundaries in the first layer of metal grains and grain boundaries in the second layer of metal grains, and the grain boundaries in the first layer of metal grains are not coplanar with the grain boundaries in the second layer of metal grains.

16. The construction according to claim 15, further comprising an oxide layer between the first layer of metal grains and the second layer of grains.

17. The construction according to claim 11, wherein said metal wiring is formed from aluminum or an aluminum alloy.

18. The construction according to claim 11, wherein said metal wiring is formed from a member of the group consisting of aluminum, aluminum-silicon, aluminum-silicon-copper, aluminum-copper, aluminum-silicon-palladium, aluminum-palladium, and aluminum-titanium.

19. A construction according to claim 11, wherein lines formed by the intersection between each of said corresponding plurality of grain boundary planes and said upper surface of said first insulation layer are perpendicular to said extending direction of said metal wiring.

20. A construction according to claim 1, wherein lines formed by the intersection between each of the corresponding plurality of grain boundary planes and said upper surface of said first insulation layer are substantially perpendicular to said extending direction of said metal wiring.

21. A construction according to claim 1, wherein lines formed by the intersection between each of the corresponding plurality of grain boundary planes of said plurality of grain boundaries and said upper surface of said first insulation layer are essentially perpendicular to said extending direction of said metal wiring.

22. A micro metal wiring construction in a large scale integrated circuit, comprising:

a substrate having an upper surface and a lower surface;

a first insulating layer having a lower surface on the upper surface of the substrate and having an upper surface, said first insulating layer having a first coefficient of thermal expansion;

a metal wiring on the upper surface of the first insulating layer, said metal wiring having a second coefficient of thermal expansion, said metal wiring being elongated along an extending direction, said metal wiring comprising a plurality of grain boundaries, each one of said plurality of grain boundaries defining a corresponding plurality of grain boundary planes;

a second insulating layer covering said metal wiring, said second insulating layer made of an insulating material having a third coefficient of thermal expansion;

wherein said second coefficient of thermal expansion is greater than said first coefficient of thermal expansion and is greater than said third coefficient of thermal expansion; and wherein one of said corresponding plurality of grain boundary planes forms an angle of greater than twenty degrees with a line that is perpendicular to said upper surface of said first insulating layer.

* * * * *

UNITED STATES PATENT AND TRADEMARK OFFICE
CERTIFICATE OF CORRECTION

PATENT NO. : 5,448,113
DATED : September 5, 1995
INVENTOR(S) : Kouei SUZUKI, et al.

It is certified that error appears in the above-indentified patent and that said Letters Patent is hereby corrected as shown below:

On the title page, the Foreign Application Priority Data has been omitted. It should read:

--Mar. 9, 1992 [JP]  Japan..........4-50720
  Jan. 28, 1993 [JP]  Japan..........5-12754--

Signed and Sealed this

Fourteenth Day of November, 1995

*Attest:*

BRUCE LEHMAN

*Attesting Officer*  *Commissioner of Patents and Trademarks*